US009565503B2

(12) United States Patent
Rodriguez

(10) Patent No.: US 9,565,503 B2
(45) Date of Patent: Feb. 7, 2017

(54) AUDIO AND LOCATION ARRANGEMENTS

(71) Applicant: Digimarc Corporation, Beaverton, OR (US)

(72) Inventor: Tony F. Rodriguez, Portland, OR (US)

(73) Assignee: Digimarc Corporation, Beaverton, OR (US)

( * ) Notice: Subject to any disclaimer, the term of this patent is extended or adjusted under 35 U.S.C. 154(b) by 148 days.

(21) Appl. No.: 14/327,988

(22) Filed: Jul. 10, 2014

(65) Prior Publication Data
US 2015/0016615 A1 Jan. 15, 2015

Related U.S. Application Data

(60) Provisional application No. 61/845,893, filed on Jul. 12, 2013.

(51) Int. Cl.
| | |
|---|---|
| *H04R 29/00* | (2006.01) |
| *G06F 3/01* | (2006.01) |
| *H04S 7/00* | (2006.01) |
| *H04N 21/435* | (2011.01) |
| *H04N 21/43* | (2011.01) |
| *A63F 9/24* | (2006.01) |
| *H03G 1/02* | (2006.01) |
| *H04N 21/235* | (2011.01) |

(52) U.S. Cl.
CPC .............. *H04R 29/00* (2013.01); *G06F 3/011* (2013.01); *H04S 7/302* (2013.01); *H04S 7/303* (2013.01); *A63F 9/24* (2013.01); *A63F 2300/6045* (2013.01); *H03G 1/02* (2013.01); *H04N 21/235* (2013.01); *H04N 21/435* (2013.01); *H04N 21/4307* (2013.01); *H04S 2400/11* (2013.01)

(58) Field of Classification Search
CPC .......... H04R 29/00; H04S 7/302; H04S 7/303; H04S 2400/11; A63F 9/24; A63F 2300/6045; H04N 21/235; H04N 21/4307; H04N 21/4307; G06F 3/011; H03G 1/02
See application file for complete search history.

(56) References Cited

U.S. PATENT DOCUMENTS

| | | | | |
|---|---|---|---|---|
| 5,872,743 | A | * | 2/1999 | Maxwell ................. H04S 7/303 367/96 |
| 6,243,476 | B1 | | 6/2001 | Gardner |
| 6,614,914 | B1 | | 9/2003 | Rhoads |
| 7,123,731 | B2 | | 10/2006 | Cohen et al. |
| 7,860,260 | B2 | | 12/2010 | Kim et al. |
| 8,031,891 | B2 | | 10/2011 | Ball et al. |
| 8,331,614 | B2 | | 12/2012 | Mannerheim et al. |
| 8,472,632 | B2 | | 6/2013 | Riedel et al. |
| 8,588,440 | B2 | | 11/2013 | Koppens et al. |
| 8,767,968 | B2 | | 7/2014 | Flaks et al. |

(Continued)

*Primary Examiner* — Andrew L Sniezek
(74) *Attorney, Agent, or Firm* — Digimarc Corporation

(57) ABSTRACT

In one arrangement, a person's position in a movie auditorium is discerned by detection of audio signals from two or more speakers, and the person is then assigned a role or task in a game based on this discerned location. In another arrangement, a person's current position in a home listening environment is similarly discerned; this position information is used to control the balance of complementary audio channels of a home audio system, so that the audio "sweet spot" is located at the person's current position. A great number of other features and arrangements are also detailed.

11 Claims, 3 Drawing Sheets

(56) References Cited

U.S. PATENT DOCUMENTS

| | | |
|---|---|---|
| 2008/0174570 A1 | 7/2008 | Jobs et al. |
| 2011/0195790 A1* | 8/2011 | Konkle .................. A63F 13/12 |
| | | 463/42 |
| 2012/0027226 A1* | 2/2012 | Desenberg ............... H04N 7/15 |
| | | 381/105 |
| 2012/0028577 A1 | 2/2012 | Rodriguez et al. |
| 2012/0095749 A1* | 4/2012 | Capretta ................ H04H 20/63 |
| | | 704/8 |
| 2012/0214515 A1 | 8/2012 | Davis et al. |
| 2014/0019247 A1* | 1/2014 | Melanson ......... H04M 1/72572 |
| | | 705/14.58 |
| 2014/0108020 A1 | 4/2014 | Sharma et al. |
| 2014/0328505 A1* | 11/2014 | Heinemann ............. H04S 7/303 |
| | | 381/303 |

\* cited by examiner

AUDIO AND LOCATION ARRANGEMENTS

RELATED APPLICATION DATA

This application claims priority to provisional application 61/845,893, filed Jul. 12, 2013, the disclosure of which is incorporated by reference.

BACKGROUND AND INTRODUCTION

Several techniques for determining location based on multiple signals are known. Some, such as the familiar GPS system, employ the differences in transit times among signals from various signal sources, and the receiver. Related techniques encode each of the signals with a common random sequence—synchronized at transmission. The common sequence allows an auto-correlation operation to be performed on the received signal, revealing the time offsets between the different occurrences of this signal sensed by the receiver. The times of transit allow the receiver to be localized relative to the sources.

Another class of techniques relies on differences in strength of signals received from the various signal sources. In a simple implementation, different signals are emitted by different sources. Whichever signal dominates at the receiver indicates the signal source to which the receiver is closest—thereby roughly indicating location. (More sophisticated embodiments consider the strengths of other, less-dominant signals, to yield a more refined location estimate.)

Still another technique relies on count-stamp techniques, as detailed in patent documents U.S. Pat. No. 7,876,266, 20100202300, 20090213828, 20090233621, and 20120309415.

While these methods are most commonly implemented with radio signals, they are similarly useful with audio signals (with corresponding adjustment, where necessary, in view of the slower speed of audio propagation).

In some implementations, the signals from the different sources—from which location is derived—may be steganographically-encoded in other signals. For example, in a retail store, the background music played through speakers in the ceiling may be steganographically encoded with signals that can be used by a shopper's portable device, to determine the shopper's location within the store—by any of the foregoing methods.

(Steganographic encoding is familiar to those versed in digital watermarking. Exemplary technology is detailed in U.S. Pat. No. 6,614,914, and in pending application Ser. No. 13/841,727, filed Mar. 15, 2013, published as 20140108020.)

The ability to determine the location of a user, from audio signals in the environment, enables a great variety of applications.

For example, a user at a movie theatre can be enabled to participate in a role-playing or other game, in which the user's position within the theatre is sensed, and used to determine some aspect of the user's role in the game, or some power or authority that the user is allowed to exercise.

In a home setting, the ability to locate the user allows adaptation of one or more audio signals sent to speakers in a multi-channel audio signal, so that the "sweet spot" of the audio system follows the user at different locations in the listening environment.

The foregoing and other features and advantages of the present technology are detailed below.

DETAILED DESCRIPTION

Figure 1:
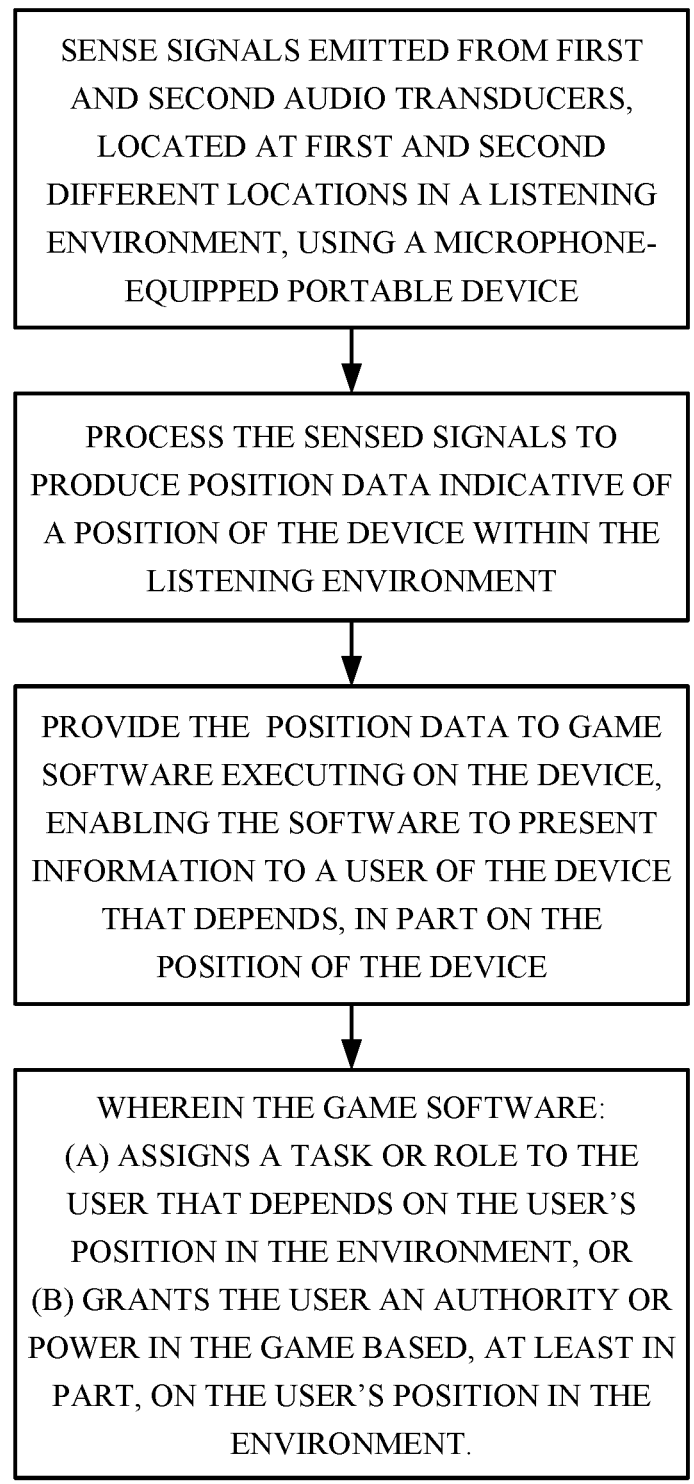
FIGS. 1-2 illustrate exemplary methods according to the present technology.

Audio systems are becoming ever-more sophisticated. Following monaural, there was stereo. After a few more generations there was 5.1 surround sound. This was followed by a great variety of more sophisticated arrangements, including 10.2, 22.2, etc. Now some high end movie screening auditoriums have advanced to 62.2 surround sound audio (i.e., 62 channels, with 2 subwoofer channels). Dolby Labs' "Atmos" technology is a commercial example of such a 62.2 system. This implementation employs a pan-through array of many speakers in the ceiling (e.g., ten or more), to provide a more truly immersive sound field.

Typically, each of the component channels is provided a different audio track. Each of these channels can be used in localization methods, e.g., using the techniques discussed above.

As the number of component channels increases, the accuracy of localization can increase commensurately. Just as a movie auditorium equipped with 62.2 surround sound can sonically simulate the trajectory of a helicopter flying over the movie audience, so too can the localization of audience members be similarly enhanced.

One particular method according to the present technology involves using a microphone-equipped portable device to sense signals emitted from first and second audio transducers, where these transducers are at first and second different locations in a listening environment (e.g., in the auditorium ceiling). The sensed signals are processed to produce position data indicative of a position of the device within the listening environment. This position data is then provided to entertainment software, which presents information to a user of the device, which depends—in part—on the position of the device.

One application of this method is in game software. For example, the entertainment software (which can be distributed across user devices and a central server) can assign a user a task in the game that depends on the user's position in the environment (i.e., the theatre auditorium).

A particular example may virtually divide the movie audience into duty stations on the bridge of the Starship Enterprise. Those at the front of the auditorium may be tasked with the helmsman duties of officer Sulu. Those at the rear of the auditorium may be tasked with the science officer duties of Dr. Spock. Those in the middle of the auditorium may assume the role of Captain Kirk. As a Star Trek narrative is played out—with presentation of thematic video on the theatre's big screen (e.g., the view out the front of the ship, interspersed with scenes of Spock, Kirk and Sulu desperately trying to stave off disaster), and particular duty station displays presented on the audience members' portable devices, these participants are called to play their respective roles in saving the Enterprise from disaster, or other plotline.

Those in the front of the auditorium may be granted the authority (or power) to control the ship's engines. If evasive maneuvers are required, it is their role to perform these tasks. If escape requires plotting an orbital path that slingshots the ship around a nearby star, it is the science officers seated in the back of the theatre who are granted access to the software navigational tools that permit this tricky maneuver to be performed. Those in the middle of the auditorium are granted the authority to fire weapons and other captainly duties.

Just as in the real Star Trek, the officers on the bridge must assimilate the big picture (e.g., as revealed on the auditorium's big screen), while attending to their particular responsibilities at their respective work areas (i.e., using the smartphone apps on their personal devices).

In this scenario, as others, the smartphone apps may activate haptic components in the viewers' portable devices, in response to control signals from the auditorium's central gaming server (e.g., relayed steganographically through audio, or sent by wireless). These haptic effects augment a motion picture presentation on the big screen, and are temporally correlated with the big screen action. The particular haptic effect, or its magnitude, can be dependent on the viewers' respective locations in the auditorium.

In another aspect, the present technology involves sensing a user's location, and adapting one or more audio signals sent to speakers in a multi-channel audio system in response. For example, these signals can be adapted so that complementary channels of the audio (e.g., front right and front left, and/or rear right and rear left) are balanced at the user's location.

In a particular such embodiment, the user's location is sensed using the techniques detailed above, using signals from two or more speakers in the multi-channel audio system. Information is extracted from these audio signals, and processed to discern the user's location. (The extracting can include extracting amplitude information for signal-strength-based location methods. Alternatively, it can include extracting signal pattern information, for time-of-arrival-based location methods, and may further include auto-correlating the extracted pattern information.)

One such implementation employs the user's smartphone as a sensor. Based on the sensed information, control signals are issued to the different amplifier modules of the audio channel to vary their respective outputs, so as to keep the system configured with the user in the acoustic "sweet spot." ("Sweet spot" is a term used by audiophiles to refer to the location in a listening environment where the auditory experience is at its best. Typically, the sweet spot is at the sonic focal point among the various speakers. See, e.g., Merchel, et al, Analysis and Implementation of a Stereophonic Play Back System for Adjusting the "Sweet Spot" to the Listener's Position, Proceedings of 126th AES Convention, Munich, Germany, 2009.) The user's smart phone may communicate with the audio system by any known method, including infrared, wireless (e.g., Bluetooth, Zigbee, WiFi), etc.

The relative outputs of the different channel amplifiers can be set according to rules triggered by different user positions. If the user is discerned to be close to the front channel speakers, their amplitudes can be diminished by a set amount, and/or the rear channel speakers can be increased in amplitude.

Alternatively, the sweet spot can be varied in accordance with a feedback arrangement. The front right and rear right speakers, for example, can be driven with steganographic signals that are equal in amplitude but opposite in phase. Their net sum at the smartphone microphone is sensed. In the sweet spot, the signals should essentially cancel (e.g., yielding a net signal that is less than the amplitude of a single signal, or less than 50%, 25%, or 10% of such amplitude). If one steganographic signal is found dominant, the gain of one set of speakers (e.g., the front speakers) can be increased to see if that change drives the net sum towards zero, or causes it to increase still further (in which case an opposite adjustment can be made). Iterative adjustments can be made to bring the complementary pair into balance. Likewise with other complementary speaker pairings, e.g., front left vs. front right. (Each pairing might be adjusted during a ten second interval, after which another pairing is tested and adjusted, and so forth, with the cycle through all complementary speaker pairings repeating.)

A different method involves configuring an entertainment system (e.g., a television system or audio system) to look for content of particular interest to a user. When such content is identified, the volume of the audio is raised to draw the user's attention. Alternatively, a signal can be sent to the user's phone, triggering an alert (e.g., an audible chime, or a haptic vibration).

In one particular implementation, a user enters keywords related to topics of interest using a portable device, such as a smartphone. These keywords may include Tour de France; Hurricane Sandy; etc. From these keywords, search criteria are developed (which may be different than the keywords, e.g., specifying metadata fields to be searched, and inserting synonyms, typical mis-spellings, and stemmed word variants). Content available at the entertainment system is processed to identify content that matches the search criteria.

The division of tasks between the user's portable device, and the entertainment system, can be arbitrary. In one arrangement, the keywords are sent from the portable device to the entertainment system. There, the corresponding search criteria are developed (e.g., search title and abstract of program metadata for these terms; do not search air date and copyright owner fields). The communication between the portable device and the entertainment system can be by any method. The entertainment system can examine program metadata (or closed captioning, or OCR output, or output from a speech recognizer applied to the audio channel, etc.) for matches and, when found, take a responsive action (e.g., raise the volume, or issue an alert to the portable device).

Or the tasks can be divided differently. For example, the portable device may develop the search criteria (which may simply be identical to the keywords), and it may obtain a feed of metadata, etc., so that it performs the matching. When a match is found, the portable device can send a signal to the entertainment system commanding it to raise the volume, etc.

Of course, other actions responsive to detection of a match with the search criteria can be initiated. For example, a digital video recorder may be instructed to record 30 or 60 minutes of the content from the moment of detection. Or if the entertainment system is playing the content in real time, the presentation can be "paused" to permit the user to come to the room having the entertainment system, and un-pause the program to enjoy the content immediately (e.g., after being haptically summoned).

Figure 2:
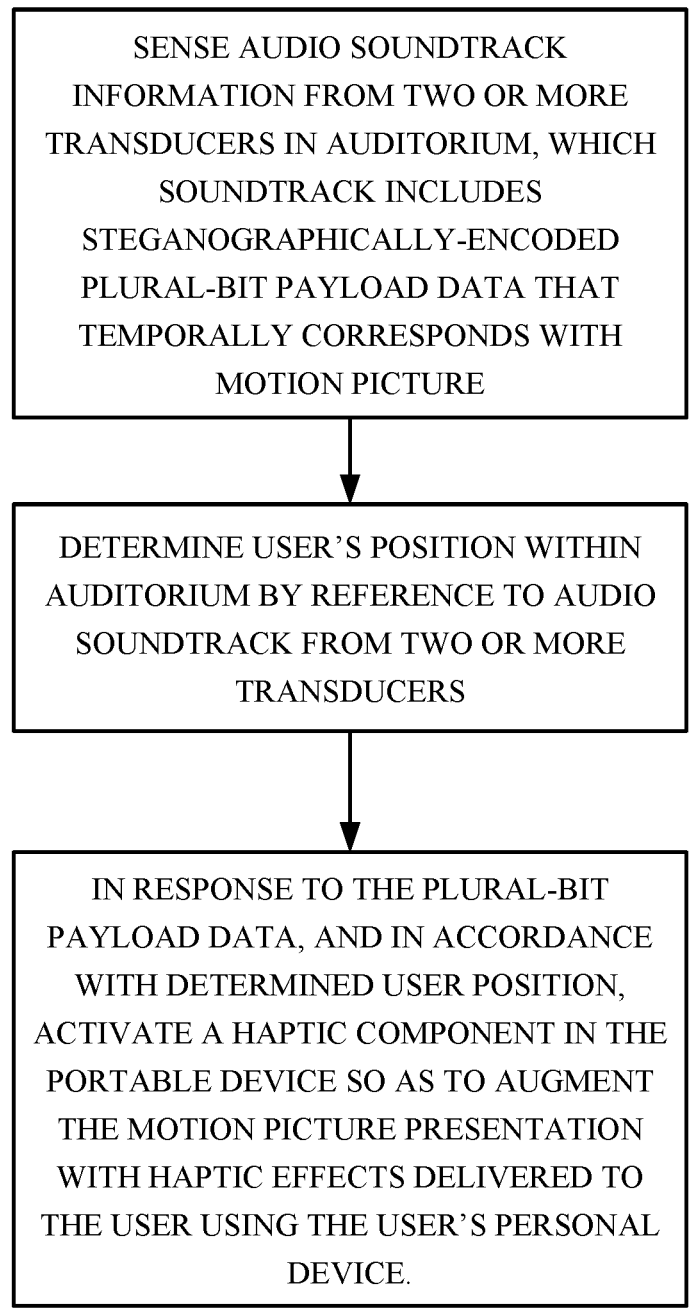
Figure 3:
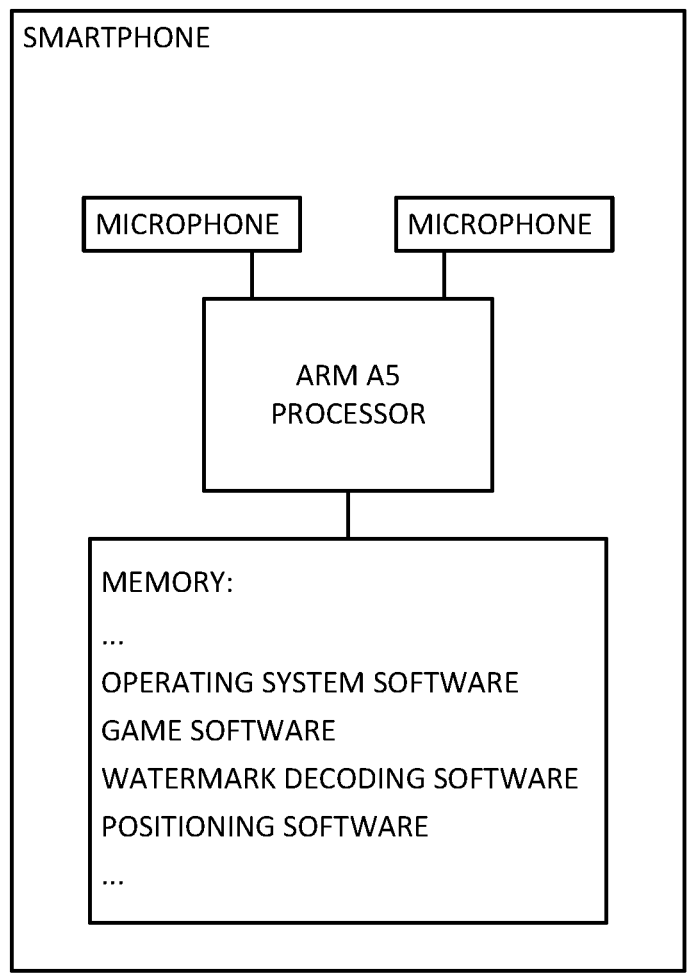
FIG. 3 is a block diagram of an exemplary smartphone incorporating aspects of the present technology.

Aspects of the foregoing arrangements are depicted in FIGS. 1-3.

CONCLUDING REMARKS

Having described and illustrated the principles of the inventive work with reference to illustrative examples, it will be recognized that the technology is not so limited.

For example, while reference was made to app software on a smartphone that performs certain of the detailed functionality, in other embodiments these functions can naturally be performed otherwise—including by operating system software on the smartphone, by a server at a social networking service, by another smartphone or computer device, distributed between such devices, etc.

Similarly, while the detailed embodiment detailed arrangements in which different human-perceptible audio tracks are provided to different speakers, in other arrangements a single such track can be provided to multiple speakers. Relatedly, while different steganographic signals may be provided to each speaker, this need not be the case. Multiple speakers can be driven with the same steganographic signals.

While reference has been made to smartphones, it will be recognized that this technology finds utility with all manner of devices—both portable and fixed. Tablets, laptop computers, digital cameras, wrist- and head-mounted systems and other wearable devices, servers, etc., can all make use of the principles detailed herein. (The term "smartphone" should be construed herein to encompass all such devices, even those that are not telephones.)

Particularly contemplated smartphones include the Apple iPhone 5; smartphones following Google's Android specification (e.g., the Galaxy S4 phone, manufactured by Samsung, the Motorola Droid Razr HD Maxx phone, and the Nokia N900), and Windows 8 mobile phones (e.g., the Nokia Lumia 920).

Details of the Apple iPhone, including its touch interface, are provided in Apple's published patent application 20080174570.

The design of smartphones and other computers referenced in this disclosure is familiar to the artisan. In general terms, each includes one or more processors, one or more memories (e.g. RAM), storage (e.g., a disk or flash memory), a user interface (which may include, e.g., a keypad, a TFT LCD or OLED display screen, touch or other gesture sensors, a camera or other optical sensor, a compass sensor, a 3D magnetometer, a 3-axis accelerometer, a 3-axis gyroscope, one or more microphones, etc., together with software instructions for providing a graphical user interface), interconnections between these elements (e.g., buses), and an interface for communicating with other devices (which may be wireless, such as GSM, 3G, 4G, CDMA, WiFi, WiMax, Zigbee or Bluetooth, and/or wired, such as through an Ethernet local area network, a T-1 internet connection, etc.).

The processes and system components detailed in this specification may be implemented as instructions for computing devices, including general purpose processor instructions for a variety of programmable processors, including microprocessors (e.g., the Intel Atom, the ARM A5, the Qualcomm Snapdragon, and the nVidia Tegra 4; the latter includes a CPU, a GPU, and nVidia's Chimera computational photography architecture), graphics processing units (GPUs, such as the nVidia Tegra APX 2600, and the Adreno 330—part of the Qualcomm Snapdragon processor), and digital signal processors (e.g., the Texas Instruments TMS320 and OMAP series devices), etc. These instructions may be implemented as software, firmware, etc. These instructions can also be implemented in various forms of processor circuitry, including programmable logic devices, field programmable gate arrays (e.g., the Xilinx Virtex series devices), field programmable object arrays, and application specific circuits—including digital, analog and mixed analog/digital circuitry. Execution of the instructions can be distributed among processors and/or made parallel across processors within a device or across a network of devices. Processing of data may also be distributed among different processor and memory devices. "Cloud" computing resources can be used as well. References to "processors," "modules" or "components" should be understood to refer to functionality, rather than requiring a particular form of implementation.

Software instructions for implementing the detailed functionality can be authored by artisans without undue experimentation from the descriptions provided herein, e.g., written in C, C++, Visual Basic, Java, Python, Tcl, Perl, Scheme, Ruby, etc., in conjunction with associated data. Smartphones and other devices according to certain implementations of the present technology can include software modules for performing the different functions and acts.

Known browser software, communications software, and media processing software can be adapted for use in implementing the present technology.

Software and hardware configuration data/instructions are commonly stored as instructions in one or more data structures conveyed by tangible media, such as magnetic or optical discs, memory cards, ROM, etc., which may be accessed across a network. Some embodiments may be implemented as embedded systems—special purpose computer systems in which operating system software and application software are indistinguishable to the user (e.g., as is commonly the case in basic cell phones). The functionality detailed in this specification can be implemented in operating system software, application software and/or as embedded system software.

Different of the functionality can be implemented on different devices. For example, in a system in which a smartphone communicates with a computer, different tasks can be performed exclusively by one device or the other, or execution can be distributed between the devices. Extraction of watermark data from content is one example of a process that can be distributed in such fashion. Thus, it should be understood that description of an operation as being performed by a particular device (e.g., a smartphone) is not limiting but exemplary; performance of the operation by another device (e.g., a server), or shared between devices, is also expressly contemplated.

In like fashion, description of data being stored on a particular device is also exemplary; data can be stored anywhere: local device, remote device, in the cloud, distributed, etc.

As indicated, the present technology can be used in connection with wearable computing systems, including headworn devices. Such devices typically include display technology by which computer information can be viewed by the user—either overlaid on the scene in front of the user (sometimes termed augmented reality), or blocking that scene (sometimes termed virtual reality), or simply in the user's peripheral vision. Such devices can further include one or multiple cameras, as well as 3D sensing technology. Exemplary technology is detailed in patent documents U.S. Pat. No. 7,397,607, 20100045869, 20090322671, 20090244097 and 20050195128. Commercial offerings, in addition to the Google Glass product, include the Vuzix Smart Glasses M100, Wrap 1200AR, and Star 1200XL systems. An upcoming alternative is augmented reality contact lenses. Such technology is detailed, e.g., in patent document 20090189830 and in Parviz, Augmented Reality in a Contact Lens, IEEE Spectrum, September, 2009. Some or all such devices may communicate, e.g., wirelessly, with other computing devices (carried by the user or otherwise), or they can include self-contained processing capability. Likewise, they may incorporate other features known from existing smart phones and patent documents, including electronic compass, accelerometers, gyroscopes, camera(s), projector(s), GPS, etc.

The techniques of digital watermarking are presumed to be familiar to the artisan. Examples are detailed, e.g., in Digimarc's patent documents U.S. Pat. Nos. 6,614,914, 6,590,996, 6,122,403, 20100150434 and 20110274310, as well as in pending application Ser. No. 13/750,752. Typically, forward error correction is employed to assure robust and accurate conveyance of data.

Applicant's other work that is relevant to the present technology includes that detailed in pending patent application Ser. No. 13/425,339, filed Mar. 20, 2012 (published as 20130097630), Ser. No. 13/651,182, filed Oct. 12, 2012 (published as 20140106710), Ser. No. 13/863,897, filed Apr. 16, 2013 (published as 20130314541), and Ser. No. 13/892,079, filed May 10, 2013 (published as 20140164124), together with published applications 20110069229, 20100228632, 20110212717, 20110214044, 20110161076, 20120284012, 20120218444, 20120300974, 20120224743 and 20120214515.

Related work by third parties (e.g., concerning moving a sweet spot in accordance with listener position, etc.) includes U.S. Pat. Nos. 6,243,476, 7,123,731, 7,860,260, 8,031,891, 8,331,614, 8,472,632, 8,588,440 and 8,767,968.

This specification has discussed several different embodiments. It should be understood that the methods, elements and concepts detailed in connection with one embodiment can be combined with the methods, elements and concepts detailed in connection with other embodiments. While some such arrangements have been particularly described, many have not—due to the large number of permutations and combinations. Applicant similarly recognizes and intends that the methods, elements and concepts of this specification can be combined, substituted and interchanged—not just among and between themselves, but also with those known from the cited prior art. Moreover, it will be recognized that the detailed technology can be included with other technologies—current and upcoming—to advantageous effect. Implementation of such combinations is straightforward to the artisan from the teachings provided in this disclosure.

While this disclosure has detailed particular ordering of acts and particular combinations of elements, it will be recognized that other contemplated methods may re-order acts (possibly omitting some and adding others), and other contemplated combinations may omit some elements and add others, etc.

Although disclosed as complete systems, sub-combinations of the detailed arrangements are also separately contemplated (e.g., omitting various of the features of a complete system).

While certain aspects of the technology have been described by reference to illustrative methods, it will be recognized that apparatuses configured to perform the acts of such methods are also contemplated as part of applicant's inventive work. Likewise, other aspects have been described by reference to illustrative apparatus, and the methodology performed by such apparatus is likewise within the scope of the present technology. Still further, tangible computer readable media containing instructions for configuring a processor or other programmable system to perform such methods is also expressly contemplated.

The present specification should be read in the context of the cited references. (The reader is presumed to be familiar with such prior work.) Those references disclose technologies and teachings that the inventors intend be incorporated into embodiments of the present technology, and into which the technologies and teachings detailed herein be incorporated.

To provide a comprehensive disclosure, while complying with the statutory requirement of conciseness, applicant incorporates-by-reference each of the documents referenced herein. (Such materials are incorporated in their entireties, even if cited above in connection with specific of their teachings.) These references disclose technologies and teachings that can be incorporated into the arrangements detailed herein, and into which the technologies and teachings detailed herein can be incorporated. The reader is presumed to be familiar with such prior work.

In view of the wide variety of embodiments to which the principles and features discussed above can be applied, it should be apparent that the detailed embodiments are illustrative only, and should not be taken as limiting the scope of the invention. Rather, we claim as our invention all such modifications as may come within the scope and spirit of the following claims and equivalents thereof.

The invention claimed is:

1. A method comprising:
using a microphone-equipped portable device to sense signals emitted from first and second audio transducers, said transducers being at first and second different locations in a listening environment;
processing the signals to produce position data indicative of a position of the device within said listening environment; and
providing said position data to game software executing on the device, enabling the software to present information to a user of the device that depends, in part on said position of the device;
wherein the game software (a) assigns a task or role to the user that depends on the user's position in the environment, or (b) grants the user an authority or power in the game based, at least in part, on the user's position in the environment.

2. The method of claim 1 in which the game software assigns a task or role that depends on the user's position in the environment.

3. The method of claim 1 in which the game software grants the user an authority or power in the game based, at least in part, on the user's position in the environment.

4. The method of claim 1 wherein each of said transducers emits first and second sound tracks, the first sound track being human-perceptible, and the second sound track being human-imperceptible in the presence of the first sound track.

5. The method of claim 4 in which the first sound track emitted by the first transducer is different than the sound track emitted by the second transducer.

6. The method of claim 1 wherein each of said transducers emits audio associated with a motion picture into the listening environment.

7. The method of claim 1 wherein said transducers emit said signals from a ceiling.

8. The method of claim 1 that includes using said device to sense signals from first, second and third transducers, each located at different positions in said listening environment.

9. The method of claim 1 that includes using said device to sense signals from more than three transducers, each located at different positions in said listening environment.

10. A method comprising:
using a sensor-equipped personal device conveyed by a user in an auditorium in which a motion picture is being presented, sensing audio soundtrack information from two or more transducers in the auditorium, the soundtrack including steganographically encoded plural-bit payload data, the steganographic encoding temporally corresponding with action in the motion picture;
determining the user's position within the auditorium by reference to said audio soundtrack information from the two or more transducers; and in response to the plural-bit payload data, and in accordance with the determined user's position, activating a haptic component in the portable device so as to augment the motion picture presentation with haptic effects delivered to the user using the user's personal device.

11. A portable device comprising one or more microphones, a processor, and a memory, the memory containing software instructions configuring the device to perform acts including:

processing signals sensed by the one or more microphones, from first and second audio transducers, positioned at first and second different locations in a listening environment, to produce position data indicating a position of the device within said listening environment;

providing said position data to game software executing on the device, enabling the software to present information to a user of the device that depends, in part on said position of the device;

wherein the game software (a) assigns a task or role to the user that depends on the user's position in the environment, or (b) grants the user an authority or power in the game based, at least in part, on the user's position in the environment.

* * * * *